(12) United States Patent
Sinha et al.

(10) Patent No.: US 8,373,460 B2
(45) Date of Patent: Feb. 12, 2013

(54) DUAL LOOP PHASE LOCKED LOOP WITH LOW VOLTAGE-CONTROLLED OSCILLATOR GAIN

(75) Inventors: Anand K. Sinha, Noida (IN); Sanjay K. Wadhwa, Noida (IN)

(73) Assignee: Freescale Semiconductor, Inc., Austin, TX (US)

(*) Notice: Subject to any disclaimer, the term of this patent is extended or adjusted under 35 U.S.C. 154(b) by 108 days.

(21) Appl. No.: 13/072,818

(22) Filed: Mar. 28, 2011

(65) Prior Publication Data

US 2012/0249198 A1    Oct. 4, 2012

(51) Int. Cl.
*H03L 7/06*    (2006.01)
(52) U.S. Cl. ......... 327/150; 327/156; 327/157; 327/159
(58) Field of Classification Search ................... 327/141, 327/144–163; 331/15–17; 375/373–376
See application file for complete search history.

(56) References Cited

U.S. PATENT DOCUMENTS

| | | | |
|---|---|---|---|
| 5,687,201 A | 11/1997 | McClellan | |
| 5,874,863 A | 2/1999 | Wojewoda | |
| 6,407,600 B1 | 6/2002 | Lu | |
| 6,674,824 B1 * | 1/2004 | Chiueh et al. | 375/376 |
| 6,919,769 B2 | 7/2005 | Lim | |
| 6,922,047 B2 | 7/2005 | Knoll | |
| 7,023,284 B2 | 4/2006 | Sogawa | |
| 7,046,093 B1 * | 5/2006 | McDonagh et al. | 331/16 |
| 7,078,977 B2 | 7/2006 | Maneatis | |
| 7,095,287 B2 | 8/2006 | Maxim | |
| 7,135,934 B2 | 11/2006 | Sanchez | |
| 7,365,581 B2 | 4/2008 | Shi | |
| 7,391,271 B2 | 6/2008 | Cranford, Jr. et al. | |
| 7,420,427 B2 | 9/2008 | Brown | |
| 7,466,174 B2 | 12/2008 | Tirumalai | |
| 7,515,003 B2 | 4/2009 | Park | |
| 7,809,345 B2 | 10/2010 | May | |
| 2003/0076140 A1 * | 4/2003 | Asano | 327/157 |
| 2007/0159262 A1 * | 7/2007 | Quan et al. | 331/16 |
| 2008/0218229 A1 | 9/2008 | Cranford et al. | |
| 2008/0265958 A1 | 10/2008 | Beaulaton | |
| 2009/0096535 A1 * | 4/2009 | Chang | 331/17 |
| 2009/0207961 A1 * | 8/2009 | Sai | 375/375 |
| 2010/0164569 A1 | 7/2010 | Bode | |
| 2010/0271137 A1 | 10/2010 | Kythakyapuzha | |
| 2010/0271138 A1 | 10/2010 | Thakur | |
| 2011/0133799 A1 * | 6/2011 | Dunworth et al. | 327/157 |

OTHER PUBLICATIONS

J. Maneatis, Low-Jitter Process-Independent DLL and PLL based on self-biased techniques, IEEE Journal of Solid State Circuits, vol. 31, pp. 1723-1732, Nov. 1996.
Stefanos Sidiropoulos et al., Adaptive Bandwidth DLLs and PLLs using Regulated Supply CMOS Buffers.
Yu-Jen Lai et al., An Agile VCO Frequency Calibration Technique for a 10-GHz CMOS PLL, IEEE Journal of Solid State Circuits vol. 42, No. 2, Feb. 2007.

* cited by examiner

*Primary Examiner* — Lincoln Donovan
*Assistant Examiner* — Brandon S Cole
(74) *Attorney, Agent, or Firm* — Charles Bergere

(57) ABSTRACT

A dual loop PLL for generating an oscillator signal initially operates in a digital loop to achieve a frequency lock between an input reference signal and a feedback signal and then the PLL operates in an analog loop to achieve a phase lock. After attaining the phase lock, the analog loop is used to maintain the phase lock across frequency and phase variation due to changes in temperature and supply.

7 Claims, 8 Drawing Sheets

| | A0 | A1 | A2 | A3 | A4 | A5 | A6 | A7 | A8 | A9 | A10 | A11 | A12 | A13 | A14 | A15 |
|---|---|---|---|---|---|---|---|---|---|---|---|---|---|---|---|---|
| t1 | 1 | 1 | 1 | 1 | 1 | 1 | 1 | 1 | 1 | 1 | 1 | 1 | 1 | 1 | 1 | 1 |
| t2 | 0 | 1 | 1 | 1 | 1 | 1 | 1 | 1 | 1 | 1 | 1 | 1 | 1 | 1 | 1 | 1 |
| t3 | 0 | 0 | 0 | 0 | 0 | 0 | 0 | 0 | 1 | 1 | 1 | 1 | 1 | 1 | 1 | 1 |
| t4 | 0 | 0 | 0 | 0 | 0 | 0 | 0 | 0 | 0 | 0 | 0 | 0 | 0 | 0 | 0 | 1 |
| t5 | 1 | 0 | 0 | 0 | 0 | 0 | 0 | 0 | 0 | 0 | 0 | 0 | 0 | 0 | 0 | 0 |
| t6 | 1 | 1 | 1 | 1 | 1 | 1 | 1 | 1 | 1 | 0 | 0 | 0 | 0 | 0 | 0 | 0 |
| t7 | 1 | 1 | 1 | 1 | 1 | 1 | 1 | 1 | 1 | 1 | 1 | 1 | 1 | 1 | 1 | 1 |
| t8 | 0 | 1 | 1 | 1 | 1 | 1 | 1 | 1 | 1 | 1 | 1 | 1 | 1 | 1 | 1 | 1 |

DUAL LOOP PHASE LOCKED LOOP WITH LOW VOLTAGE-CONTROLLED OSCILLATOR GAIN

BACKGROUND OF THE INVENTION

The present invention relates to a phase locked loop (PLL), and, more particularly, to a system for reducing Voltage Controlled Oscillator (VCO) gain of a PLL.

A PLL is used to generate an oscillator signal based on an input reference signal. The oscillator signal has a phase that is directly related with the phase of the input reference signal. PLLs are widely used in modern electronic systems such as radios, telecommunication systems, computers, and so forth. In communication systems, the PLLs are used to generate oscillator signals that are used for modulation and demodulation of a message signal. In electronic circuits, PLLs generate oscillator signals that are used as clock signals for synchronous operation of the circuits. To generate an oscillator signal having a predefined phase characteristic, an input reference signal and a feedback signal derived from the oscillator signal are provided to the PLL. When a lock is achieved, the phase of the oscillator signal locks to the phase of the input reference signal in accordance with a predefined relationship. For example, the PLL may be programmed to generate an oscillator signal having a frequency that is an integral multiple of the frequency of the input reference signal.

Depending on the operating frequency range, the PLL may be programmed to generate an oscillator signal having a wide range of relationships with the input reference signal, as the operating frequency range has a direct relationship with the VCO gain ($K_{VCO}$), where the higher the operating frequency range, the higher the VCO gain ($K_{VCO}$). However, with an increase in the frequency range, the PLL becomes increasingly susceptible to variations in the input reference signal and VCO control voltage (supply or substrate injected). The reason for the increased susceptibility may be attributed to the high $K_{VCO}$ of the PLL. For example, in a PLL with high $K_{VCO}$, such as $K_{VCO}$=4000 MHz/V, a 1 mV variation in the input to the VCO control voltage (caused by variations in the input reference signal or supply/substrate noise) translates into a 4 MHz variation in the oscillator signal frequency. Such variations are not desirable when the oscillator signal is required to accurately follow a predefined relationship with the input reference signal. To overcome the above limitation, a PLL including both digital and analog calibration loops has been proposed.

Referring now to FIG. 1, a schematic diagram illustrating a PLL 100 with digital and analog calibration loops is shown. More particularly, the PLL 100 includes an analog calibration loop 102, a digital calibration loop 104, a phase-frequency detector (PFD) 106, a frequency divider 108, and a VCO 110. The analog calibration loop 102 includes a charge pump 112a and an analog filter 114, while the digital calibration loop 104 includes a charge pump 112b, a coarse analog-to-digital converter (ADC) 116, an optional integration stage 118, and a digital filter 120.

The frequency calibration of the PLL 100 is initiated by operating the PLL 100 in a digital calibration mode. To operate the PLL 100 in the digital calibration mode, the charge pump 112b is enabled and a reference voltage ($V_{ref}$) is provided to the analog filter 114. This results in the analog filter 114 generating a constant bias voltage for the VCO 110 throughout the digital calibration mode. A switch 'S' is connected to a terminal T2 so that the output of the digital filter 120 is provided to the VCO 110. An oscillator signal is thus generated by the VCO 110 based on the inputs received from the analog filter 114 and the digital filter 120. The oscillator signal is then provided to the PFD 106 by way of the frequency divider 108 as a feedback signal. The frequency divider 108 reduces the frequency of the oscillator signal by a predetermined factor 'N' to generate the feedback signal. The PFD 106 also receives an input reference signal that is generated externally using a crystal oscillator. The PFD 106 compares the input reference signal and the feedback signal to generate either an UP signal or a DOWN signal. An UP signal is generated when the rising edge of the input reference signal leads the rising edge of the feedback signal. A DOWN signal is generated when the rising edge of the input reference signal lags the rising edge of the feedback signal. The UP signal represents an increase in the frequency of the oscillator signal and the DOWN signal represents a decrease in the frequency of the oscillator signal. The UP or the DOWN signal is transmitted to the charge pump 112b. The charge pump 112b drives a capacitor $C_1$ that integrates the output of the charge pump 112b to convert the phase difference between the input reference signal and the feedback signal into a voltage.

The voltage at the terminal of the capacitor $C_1$ is provided to the coarse ADC 116. The coarse ADC 116 generates digital signals corresponding to the voltage at the terminal of the capacitor $C_1$. The digital signals may be passed through the optional integration stage 118. The optional integration stage 118 integrates the digital signals to increase the resolution. Thereafter, the output of the coarse ADC 116 (or the optional integration stage 118, if employed) is provided to the digital filter 120. The digital filter 120 averages the output signals from the coarse ADC 116 to generate digital control words for the VCO 110. The VCO 110 integrates the digital control word input to generate the oscillator signal.

The PLL 100 is operated in the digital calibration mode until the frequency of the oscillator signal ($F_{osc}$) is approximately equal to a required output frequency ($F_{out}$). For example, if $F_{out}$=500 MHz, the digital mode operation may be halted when $F_{osc}$=500.399 MHz. Thus, the digital calibration mode provides a coarse calibration of the PLL 100.

After the coarse calibration, the analog calibration mode is enabled. In this mode, the charge pump 112b is disabled and the switch 'S' is connected to the terminal T1, which results in the output of the coarse ADC 116 (or the optional integration stage 118, if employed) being provided to the VCO 110. Since the digital control word output of the digital filter 118 is unstable, it is preferred to provide the output of the coarse ADC 116 (or the optional integration stage 118, if used), which is a smoothed estimate of the output of the digital filter 120, as the digital control word for the VCO 110. The input from the coarse ADC 116 (or the optional integration stage 118) centers the frequency of the oscillator signal generated by the VCO 110 at $F_{osc}$. Additionally, $V_{ref}$ is disconnected from the analog filter 114 and the charge pump 112a is enabled. The charge pump 112a either supplies or extracts electric charge from the analog filter 114 depending on whether the UP or DOWN signal is output by the PFD 106. The analog filter 114 generates an output voltage, which when provided to the VCO 110, leads to fine adjustments in the frequency of the oscillator signal. As illustrated in the above example, the analog mode is initiated when the required output frequency is $F_{out}$=500 MHz and when the oscillator signal frequency has become $F_{osc}$=500.399 MHz. Thus, in the analog mode, the oscillator signal frequency requires small adjustments of the order of few KHz to achieve a phase lock. Since a small frequency range is required during analog calibration, the desired VCO gain, $K_{VCO}$, to achieve this also is small, which reduces the susceptibility of the PLL to variations in the input reference signal and noise injected due to supply/substrate, thereby reducing jitter in the oscillator signal.

However, the above solution has several drawbacks. Since the digital loop 104 is realized using analog components, i.e., the charge pump 112b and the coarse ADC 116, the physical implementation of the circuit is complicated, leading to increased manufacturing costs and increased time-to-market. Further, the capacitor C1 used for sampling the output of the charge pump 112b increases the on-chip area of the circuit, which leads to an increase in product cost. Additionally, the PLL 100 includes a minimum of three poles, where the first pole is introduced by the capacitor $C_1$, the second pole is introduced by the integrator after the coarse ADC 116, and the third pole is introduced by the VCO 110. Thus, to stabilize the PLL, the digital filter 120 must realize at least two zeros, which makes implementation of the digital filter 120 complicated. Therefore, it would be advantageous to have a PLL with reduced VCO gain as well as a simpler electronic circuit for enabling easier and less costly implementation.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

FIG. 5 is a signal transition matrix illustrating transitioning of various signals of the TDC in accordance with an embodiment of the present invention.

DETAILED DESCRIPTION OF THE PRESENT INVENTION

Figure 1:
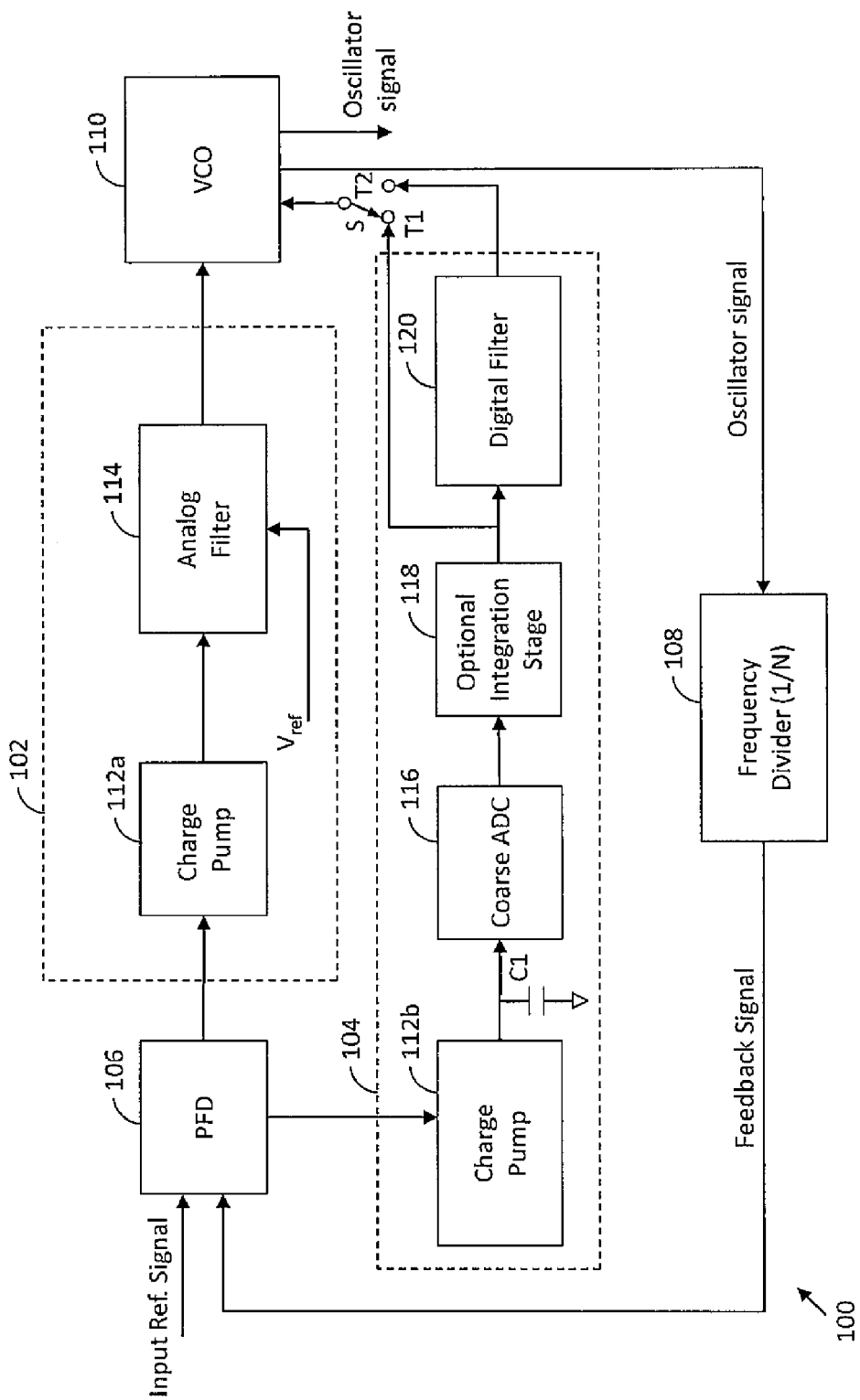
FIG. 1 is a schematic diagram of a conventional phase locked loop (PLL)

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a phase-locked loop (PLL) for generating an oscillator signal is provided. The PLL includes a phase-frequency detector (PFD) for generating an analog error signal based on an input reference signal and a feedback signal. The feedback signal is generated using the oscillator signal. Further, the PLL includes a digital loop, coupled to the PFD, for enabling a frequency lock between the input reference signal and the feedback signal. The digital loop includes a time-to-digital converter (TDC), connected to the PFD, for converting the analog error signal to a digital error signal and a digital filter for generating one or more control words based on the digital error signal. The digital loop further includes a digital-to-analog converter (DAC) current source, connected to the digital filter, for generating a first current corresponding to the one or more control words.

The PLL further includes an analog loop, connected to the PFD, for enabling a phase lock between the input reference signal and the feedback signal. The analog loop includes a charge pump, connected to the PFD, for generating a charge pump current based on the analog error signal and an analog filter, connected to the charge pump, for generating a control voltage based on the charge pump current. The analog loop further includes a voltage-to-current converter, connected to the analog filter, for generating a second current based on the control voltage. Further, the PLL includes a current-controlled oscillator (CCO), connected to the DAC current source and the voltage-to-current converter, for generating the oscillator signal based on at least one of the first current and the second current.

Still further, the PLL includes a frequency divider connected between the CCO and the PFD for generating the feedback signal by adjusting the frequency of the oscillator signal.

In another embodiment of the present invention, a system for generating an oscillator signal is provided. The system includes a phase-frequency detector (PFD) for generating an analog error signal based on an input reference signal and a feedback signal. The feedback signal is generated using the oscillator signal. Further, the system includes a digital loop, coupled to the PFD, for enabling a frequency lock between the input reference signal and the feedback signal. The digital loop includes a time-to-digital converter (TDC), connected to the PFD, for converting the analog error signal to a digital error signal and a digital filter for generating one or more control words based on the digital error signal. The digital loop further includes a digital-to-analog converter (DAC) current source, connected to the digital filter, for generating a first current corresponding to the one or more control words.

The system further includes an analog loop, connected to the PFD, for enabling a phase lock between the input reference signal and the feedback signal. The analog loop includes a charge pump, connected to the PFD, for generating a charge pump current based on the analog error signal and an analog filter, connected to the charge pump, for generating a control voltage based on the charge pump current. The analog loop further includes a voltage-to-current converter, connected to the analog filter, for generating a second current based on the control voltage. Further, the system includes a current-controlled oscillator (CCO), connected to the DAC current source and the voltage-to-current converter, for generating the oscillator signal based on at least one of the first current and the second current.

In yet another embodiment of the present invention, a method for generating an oscillator signal with a phase-locked loop (PLL) is provided. The PLL includes a digital loop and an analog loop. The method includes generating an analog error signal based on a comparison between an input reference signal and a feedback signal. The feedback signal is generated using the oscillator signal. Further, a control voltage of the analog loop is fixed at a predetermined value. This results in the analog loop providing a fixed current to the CCO. Thereafter, the analog error signal is converted into a digital error signal using a time-to-digital converter (TDC). Still further, one or more control words are generated based on the digital error signal and are provided to a digital-to-analog converter (DAC) current source. The DAC current source generates a first current using the one or more control words. Thereafter, the first current is fixed when a frequency lock is achieved between the feedback signal and the input reference signal, and a second current is modified by operating the PLL in the analog loop. Subsequently, the oscillator signal is generated using at least one of the first and second currents.

Various embodiments of the present invention provide a dual loop PLL that may be operated in a digital loop and an analog loop. At the beginning of the operation, the PLL is operated in the digital loop. The operation in the digital loop provides a coarse tuning to the oscillator signal. At the end of the digital loop operation, the frequency of the oscillator signal is approximately equal to the required output frequency, thereby providing an approximate frequency lock to the PLL. Then the PLL is operated using the analog loop. Since the oscillator signal frequency is almost equal to the required output frequency, small adjustments of the order of only a few KHz are required to be made to the oscillator signal frequency to achieve a phase lock. Thus, the gain $K_{VCO}$ required is less than the gain $K_{VCO}$ of a PLL operating using only analog loop dynamics. The reduction in the value of $K_{VCO}$ results in a reduction in the jitter in the oscillator signal.

Further, the digital loop is realized using digital components (time-to-digital converter); as a result the implementation is less complex when compared with a digital loop realized using analog components (charge pump and ADC). Additionally, the digital components do not introduce poles in the circuit. This results in a simple digital filter design. Due to the all-digital implementation, the area occupied by the circuit is also less as compared with the area occupied by a circuit with analog implementation. Further, the frequency lock and phase lock are achieved by a closed loop system. This results in better performance across process, voltage, and temperature (PVT) variations. Since a combination of digital and analog loops is used to obtain frequency and phase lock, the PLL achieves high frequency resolution, broad frequency range at a low voltage supply, low power consumption, and the ability to operate at low supply voltage. Additionally, the PLL does not require a separate calibration circuit for achieving the frequency lock. This results in a faster lock time.

Figure 2A:
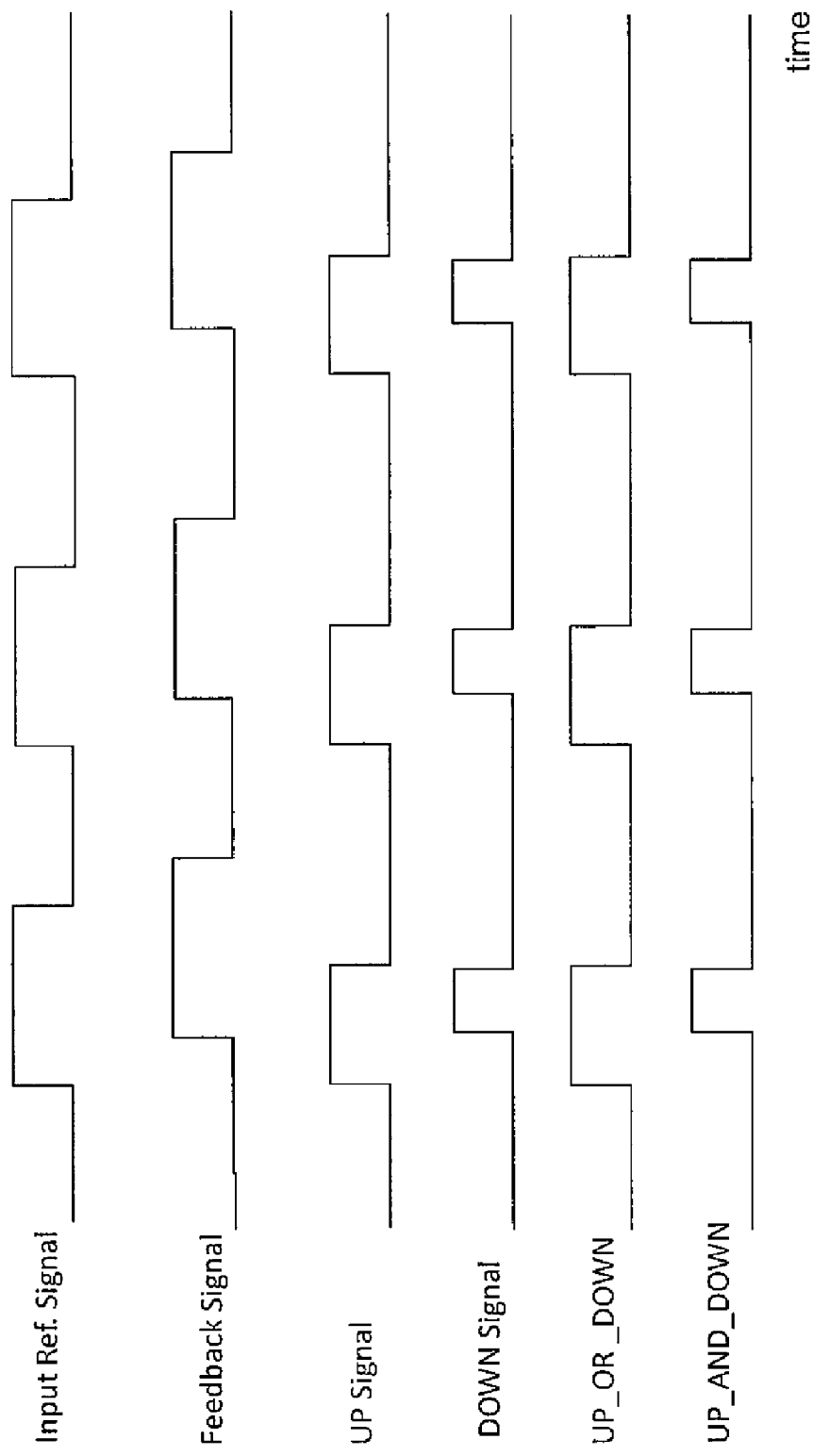
FIGS. 2A and 2B are timing diagrams illustrating generation of UP and DOWN signals in accordance with an embodiment of the present invention.
Figure 2B:
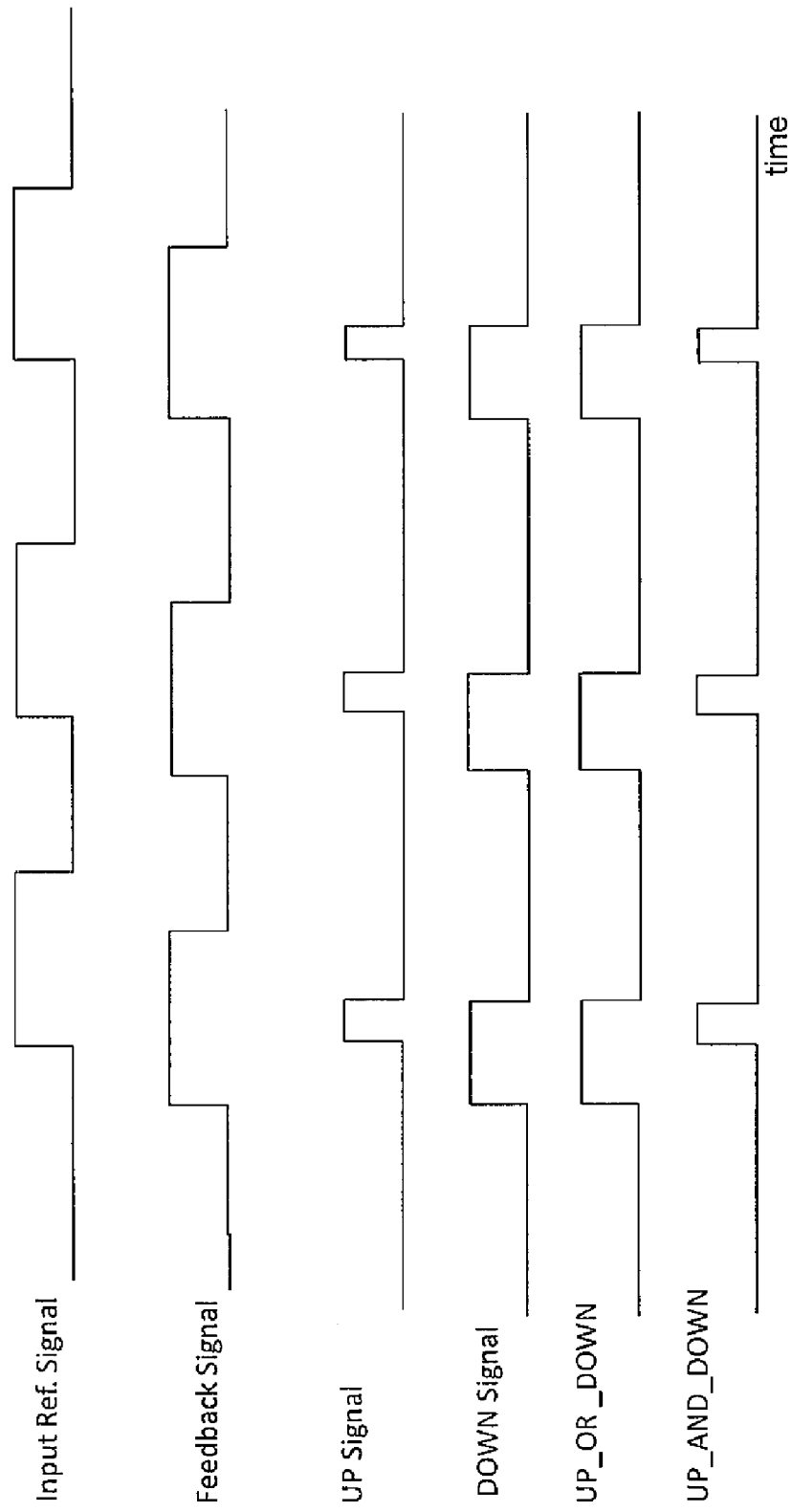

Referring now to FIGS. 2A and 2B, timing diagrams in accordance with an embodiment of the present invention are shown. The timing diagrams include an input reference signal, a feedback signal, an UP signal, a DOWN signal, an UP_OR_DOWN signal, and an UP_AND_DOWN signal. FIG. 2A illustrates a scenario in which the input reference signal leads the feedback signal and FIG. 2B illustrates a scenario in which the input reference signal lags the feedback signal. FIGS. 2A and 2B are described below in detail in conjunction with FIG. 3.

Figure 3:
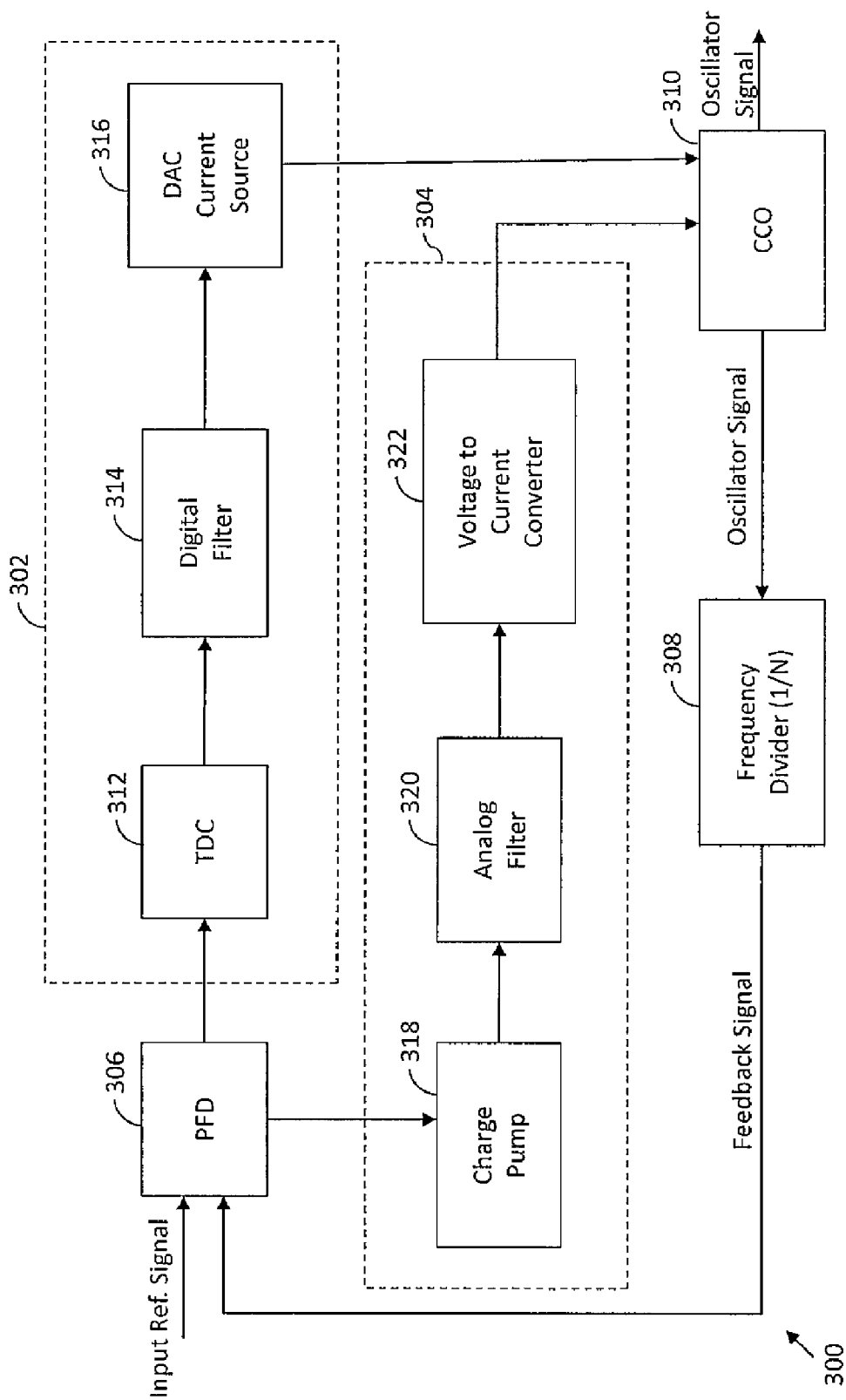
FIG. 3 is a schematic diagram of a dual loop PLL in accordance with an embodiment of the present invention.

Referring now to FIG. 3, a schematic diagram of a dual loop PLL 300 is shown, in accordance with an embodiment of the present invention. The PLL 300 includes a digital loop 302, an analog loop 304, a phase-frequency detector (PFD) 306, a frequency divider 308, and a current controlled oscillator (CCO) 310. The digital loop 302 includes a time-to-digital converter (TDC) 312, a digital filter 314, and a digital-to-analog converter (DAC) current source 316. The analog loop 304 includes a charge pump 318, an analog filter 320, and a voltage-to-current converter 322. FIG. 3 will now be described in conjunction with FIGS. 2A and 2B.

At the beginning, the PLL 300 is operated in a digital mode in which the digital loop 302 is operational. During this time period, the analog loop 304 control voltage is fixed at a predetermined value. This results in the analog loop 304 providing a fixed current to the CCO 310. The PFD 306 is provided an input reference signal of a predefined frequency. In an embodiment of the present invention, the input reference signal is generated using an external crystal oscillator. Further, the PFD 306 receives a feedback signal. The PFD 306 compares the input reference signal (refer FIGS. 2A and 2B) and the feedback signal (refer FIGS. 2A and 2B) to generate an analog error signal. The analog error signal includes either an UP signal or a DOWN signal for representing the phase difference between the input reference signal and the feedback signal.

The UP signal (see FIGS. 2A and 2B) is generated when the rising edge of the input reference signal is obtained and the DOWN signal is generates when the rising edge of the feedback signal is obtained. The UP signal is generated first if the input reference signal leads the feedback signal, signifying that the frequency of the feedback signal needs to be increased. On the other hand, the DOWN signal is generated first if the rising edge of the input reference signal lags the feedback signal, signifying that the frequency of the feedback signal needs to be decreased. Further, the UP and DOWN signals are passed through an OR gate and an AND gate (not shown) to generate an UP_OR_DOWN signal and an UP_AND_DOWN signal, respectively. The UP_OR_DOWN signal and the UP_AND_DOWN signal are then provided to the TDC 312 for further processing.

The TDC 312 converts the analog error signal representing the phase difference between the input reference signal and the feedback signal in analog form into a corresponding digital error signal. In an embodiment of the present invention, the digital error signal is coded in binary format. The functioning of the TDC 312 has been described in detail later in conjunction with FIG. 4 and FIG. 5. The digital error signal is then provided to the digital filter 314. The digital filter 314 generates one or more control words for the DAC current source 316 corresponding to the digital error signal. The DAC current source 316 generates a first current based on the one or more control words received from the digital filter 314. In an embodiment of the present invention, the DAC current source 316 includes one or more binary-weighted current sources. Each of these binary-weighted current sources is either turned on or turned off based on the corresponding value of the bit in the control word, to generate the first current. The first current is then provided to the CCO 310 for generating an oscillator signal based on the first current. Since a CCO is well-known in the art, a detailed explanation has been excluded from the present description for the sake of brevity. The oscillator signal is then provided to the frequency divider 308. The frequency divider 308 divides the oscillator signal by a predetermined factor 'N' to generate the feedback signal that is provided to the PFD 306. In an embodiment of the present invention, 'N' is a positive integer multiple.

The PLL 300 continues to operate in the digital mode until an approximate frequency lock is achieved between the feedback signal and the input reference signal. In an example, when the frequency of the oscillator signal is $F_{osc}$=400.299 MHz and the required output frequency is $F_{out}$=400 MHz, the digital mode of the PLL 300 is halted. It will be understood by persons skilled in the art that since the feedback signal is a derivative of the oscillator signal and the required output frequency may be expressed in terms of the input reference signal, the digital mode may be halted based on a comparison of the oscillator signal frequency ($F_{osc}$) and required output frequency ($F_{out}$). Thus, operating the PLL 300 in the digital loop 302 provides coarse tuning to generate the oscillator signal having a frequency approximately equal to required output frequency.

When the digital mode is halted and the PLL 300 is begun to be operated using the analog loop 304, the magnitude of the first current is fixed corresponding to the condition when the frequency lock is achieved. The magnitude of the first current is held at the value corresponding to which the frequency lock is achieved during the complete analog operation of the PLL 300.

For analog loop operation, the analog loop 304 is enabled and the charge pump 318 is provided with the analog error signal generated by the PFD 306. As explained in the foregoing specifications, the PFD 306 generates an UP signal or a DOWN signal based on whether the frequency of the feedback signal is less than the frequency of the input reference signal or whether the frequency of the feedback signal is greater than the frequency of the input reference signal. The charge pump 318 generates a charge pump current based on the analog error signal that corresponds to the phase difference between the input reference signal and the feedback signal. Using the charge pump current, the charge pump 318 supplies or extracts electric charge from the analog filter 320. The supply or extraction of the electric charge is performed based on whether the frequency of the oscillator signal ($F_{osc}$) needs to increased or decreased, respectively.

The analog filter 320 generates a control voltage in response to the charge pump current. The control voltage generated by the analog filter 320 is provided to the voltage-to-current converter 322. The voltage-to-current converter 322 modifies a second current based on the control voltage. The second current is then transmitted to the CCO 310. The CCO 310 adjusts the frequency of the oscillator signal based on the value of the second current. As explained above, the digital loop 302 tunes the PLL 300 to achieve an approximate frequency lock in which the frequency difference between the oscillator signal and the required output frequency is of the order of only a few KHz (400.299-400 MHz). Thus, when the analog mode is initiated, the oscillator signal frequency needs to be adjusted by only small values to obtain a phase lock. As a result, the gain of the VCO ($K_{VCO}$) also is small as compared to when the phase lock is achieved by the analog loop 302 only. Subsequent to achieving the phase lock, the analog loop 304 is used to maintain a phase lock across temperature and supply variations.

Figure 4:
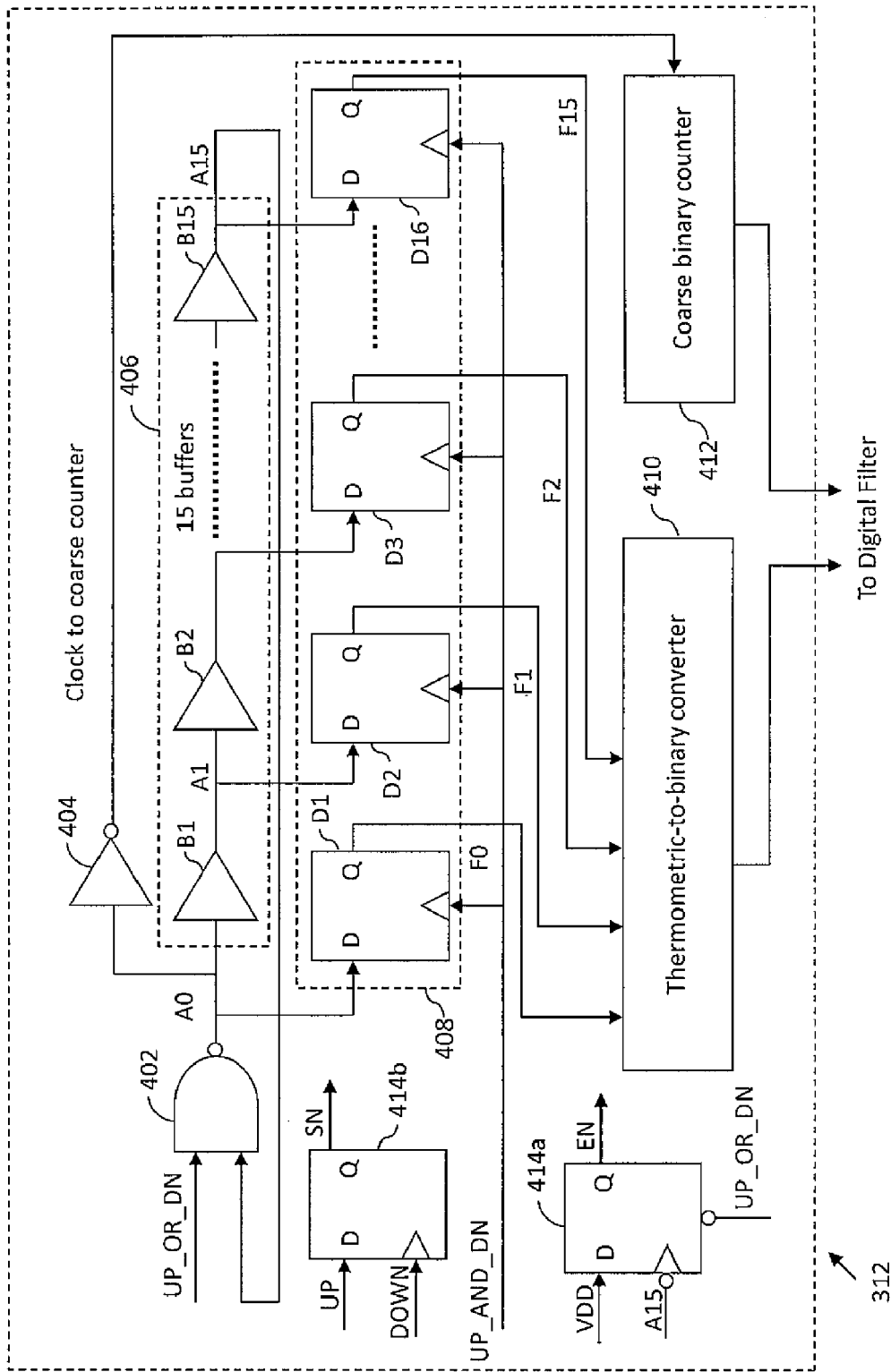
FIG. 4 is a schematic diagram of a time-to-digital (TDC) converter used in the dual loop PLL of FIG. 3 in accordance with an embodiment of the present invention.

Referring now to FIG. 4, a schematic diagram of the TDC 312 used in the dual loop PLL of FIG. 3 is shown, in accordance with an embodiment of the present invention. The TDC 312 includes a NAND gate 402, a NOT gate 404, a tapped delay line 406, a loop feedback counter 408, a thermometric-to-binary converter 410, a coarse binary counter 412, and D flip-flops 414a and 414b.

The TDC 312 receives an UP_OR_DOWN signal (refer FIGS. 2A and 2B) and an UP_AND_DOWN signal (refer FIGS. 2A and 2B) generated using the analog error signal that includes an UP signal and a DOWN signal. The UP_OR_DOWN signal is provided to the NAND gate 402 and the UP_AND_DOWN signal is provided as a sample clock to the D flip-flops D1, D2, D3 . . . D16 within the loop feedback counter 408. The NAND gate 402 also receives an input from the last buffer B15 belonging to the tapped delay line 406. The output of the NAND gate 402 is coupled to the buffer B1 of the tapped delay line 406 and to the input of the D flip-flop D1. The output of the NAND gate 402 is connected to the input of the NOT gate 404, the output of which is provided as a clock signal to the coarse binary counter 412.

The tapped delay line 406 includes buffers B2 to B15 that are connected in series with the buffer B1. The outputs of each of the buffers B1 to B15 are provided as inputs to the D flip-flops D2 to D16, and the outputs of the D flip-flops D1 to D16 are provided as inputs to the thermometric-to-binary converter 410. The output of the thermometric-to-binary converter 410 is combined with the output of the coarse binary counter 412 and is then provided to the digital filter 314 (refer to FIG. 3). Additionally, the D flip-flop 414a receives a constant high input signal (VDD) as an input signal, the complement of the output of the buffer B15, i.e., A15, as an input clock signal, and the UP_OR_DN signal as a reset signal. The D flip-flop 414a generates an enable signal (EN) for the coarse binary counter 412. The D flip-flop 414b receives the UP signal as an input signal and the DOWN signal as an input clock signal and generates a sign-bit (SN).

Referring now to FIG. 5, a signal transition matrix 500 in accordance with an embodiment of the present invention is shown. The signal transition matrix 500 includes the signal values at nodes A0 to A15 (see FIG. 4) at various instants in time, t1 to t8, during the operation of the TDC 312.

At time t1, the nodes A0 to A15 have a signal value 1. Since the node A0 is coupled to the output of the NAND gate 402, then the UP_OR_DOWN signal is 0. At time t2, the node A0 transitions to 0 and the UP_OR_DOWN signal has transitioned to 1. Since A0 to A15 are connected using the buffers B1 to B15, the signal value at A0 is not instantaneously transmitted to the subsequent nodes, but is delayed by the intervening buffers. Thus, the nodes A1 to A15 hold their initial signal values even though A0 transitions to 0. Further, since the UP_OR_DOWN signal switches to a high value, there is a mismatch in the frequencies of the feedback signal and the input reference signal, i.e., either the UP signal is high or the DOWN signal is high. The longer the UP_OR_DOWN signal remains high, the higher the mismatch in the frequencies. As a result, the 0 value travels farther in the buffer chain of the tapped delay line 406, viz., in the time period t3 to t4, the 0 traverses from the buffer B7 to B14. Time instants t5 to t8 represent correspondingly higher phase differences between the reference signal and the feedback signal. Additionally, transition of node A0 from 1 to 0 leads to a transition at the output of the NOT gate 404 from 0 to 1. Since the output of the NOT gate 404 is provided as the clock signal to the coarse binary counter 412, the coarse binary counter 412 receives a clock pulse and is incremented by 1. Further, as mentioned above, the complement of the node A15 is connected as an enable signal to the D flip-flop 414a, which also receives the constant high input signal (VDD). The output of the D flip-flop 414a is provided as the enable signal (EN) to the coarse binary counter 412. Additionally, the D flip-flop 414a is reset every time the UP_OR_DOWN signal transitions to low, denoting the beginning of a new phase difference cycle. Thus, whenever A15 transitions from 1 to 0, the coarse binary counter 412 is enabled and then incremented by 1 when A0 transitions from 1 to 0.

The signal values at the nodes A0 to A15 are sampled by the D flip-flops D1 to D16 on a rising edge of the UP_AND_DOWN signal. Then the outputs of the D flip-flops D1 to D16 are provided as inputs (F0 to F15) to the thermometric-to-binary converter 410. The outputs of the D flip-flops signify the fine measurement counts of the phase difference between the input reference signal and the feedback signal and the output of the coarse binary counter 412 signifies the coarse measurement counts of the phase difference measured as cycles. The thermometric-to-binary converter 410 converts the fine count signals (F0 to F15) to a corresponding binary code, which is then combined with the binary output of the coarse binary counter 412. The combined output then represents the digital equivalent of the total phase difference between the input reference signal and the feedback signal at the time instant when the D flop-flops D1 to D16 are sampled.

The digital equivalent of the phase difference is then provided to the digital filter 314 for further processing. Thus, the TDC 312 converts the analog error signal provided as the UP_OR_DOWN signal and the UP_AND_DOWN signal into an equivalent digital error signal in the form of the combined output of the thermometric-to-binary converter 410 and the coarse binary counter 412.

A high state of the UP_OR_DOWN signal does not explicitly represent that the feedback signal frequency is less than the input reference signal frequency, so the sign-bit (SN) is generated using the D flip-flop 414b. The UP signal is sampled by the D flip-flop 414b using the DOWN signal as the input clock signal. Thus, when the sign-bit (SN) is high, the frequency of the oscillator signal is increased and vice-versa.

Figure 6A:
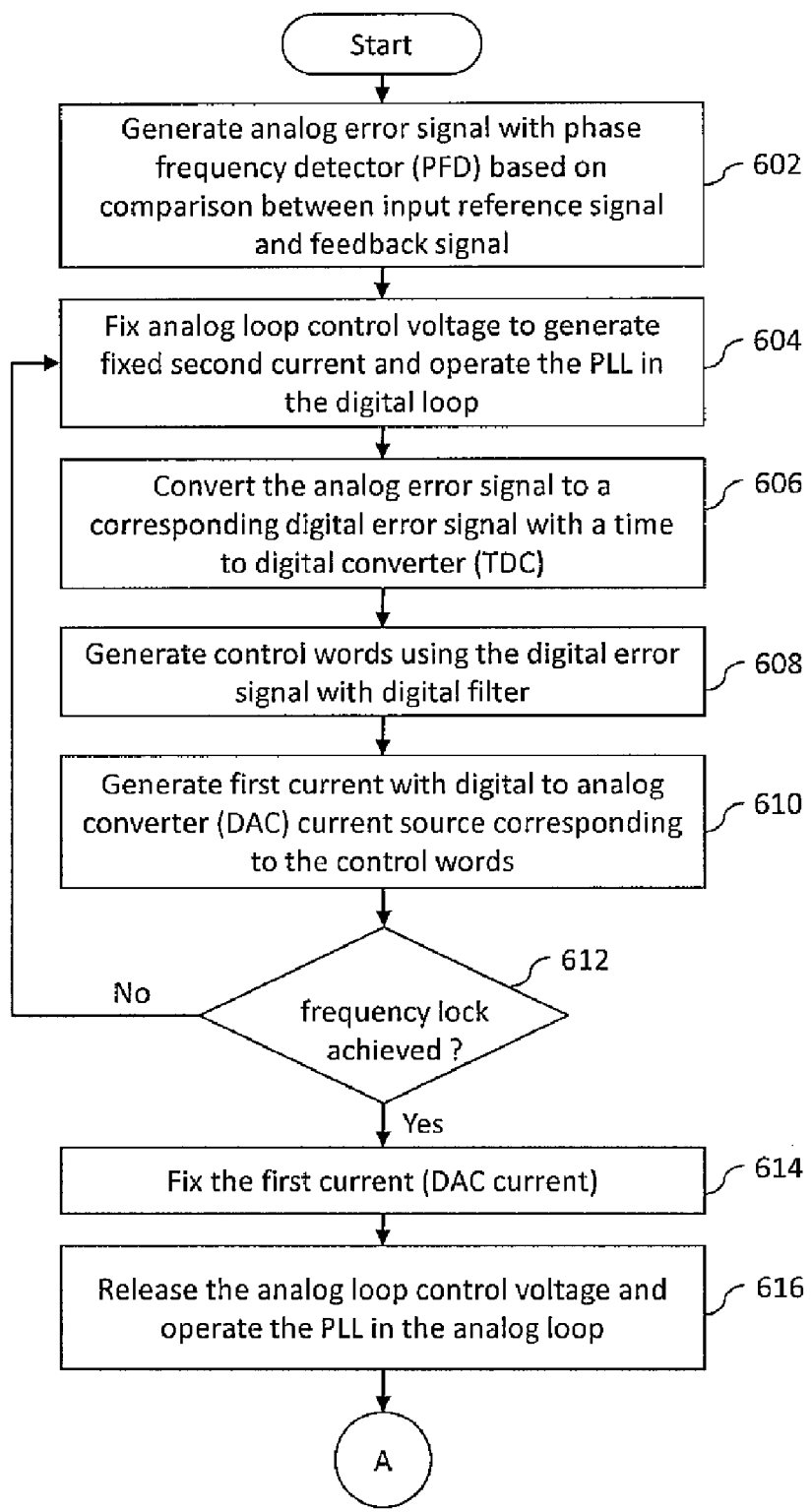
FIGS. 6A and 6B are flowcharts illustrating a method to operate the dual loop PLL in accordance with an embodiment of the present invention.
Figure 6B:
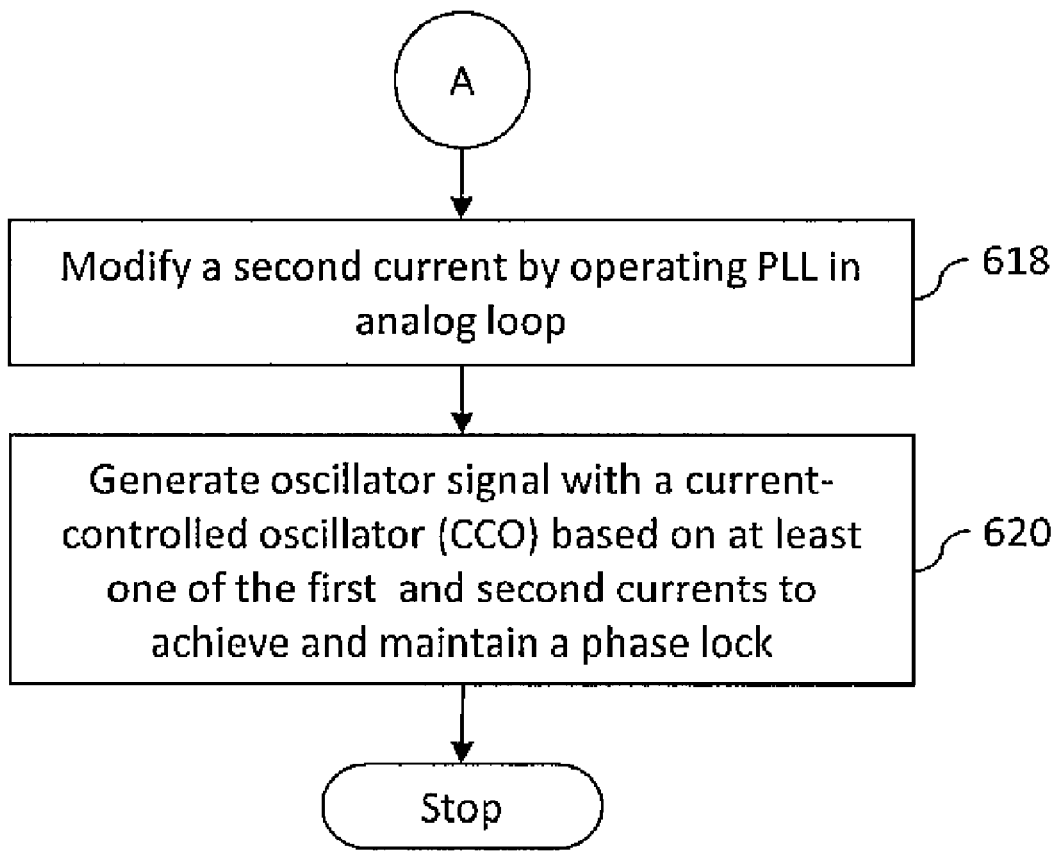

Referring now to FIGS. 6A and 6B, a flowchart illustrating a method to operate a PLL in accordance with an embodiment of the present invention is shown, where the PLL includes a digital loop and an analog loop. At step 602, an analog error signal is generated by a PFD, based on a comparison between an input reference signal and a feedback signal. The feedback signal is generated using an oscillator signal that is generated as an output by the PLL. At step 604, the control voltage of the analog loop of the PLL is set to a predetermined value that results in the analog loop providing a second current of fixed magnitude to a current controlled oscillator (CCO). Since the control voltage of the analog loop is fixed, the analog loop does not operate and instead the PLL operates using the digital loop. As explained earlier, the digital mode is the coarse tuning mode at the end of which an approximate frequency lock is achieved between the input reference signal and the feedback signal. At step 606, the analog error signal is converted to an equivalent digital error signal by a TDC. The analog error signal is converted to an equivalent digital error signal as was explained above with reference to FIGS. 4 and 5.

At step 608, the digital filter converts the digital error signal into one or more control words that are provided to a DAC current source. In an embodiment of the present invention, the DAC current source includes one or more binary weighted current sources. At step 610, the DAC current source generates a first current corresponding to the one or more control words received from the digital filter. At step 612, a check is performed to determine whether a frequency lock has been achieved between the input reference signal and the feedback signal. In an embodiment of the present invention, the frequency lock obtained using the digital loop is a coarse frequency lock, in which the difference between the oscillator signal frequency and the required output frequency is just a few KHz. If it is determined at step 612 that a frequency lock has not been achieved, steps 604-610 are repeated until a frequency lock has been achieved. However, if at step 612, it is determined that the frequency lock has been achieved, step 614 is executed. At step 614, the magnitude of the first current (generated by DAC current source) is fixed or held at a value that corresponds to the frequency lock. At step 616, the analog loop control voltage is released and the digital loop control signal is set. Thus, the PLL operates using the analog loop. During the analog operation, the analog error signal is provided to a charge pump. The charge pump, in response to the analog error signal, generates a charge pump current that supplies or extracts electric charge from an analog filter.

At step 618, the second current is modified by a voltage-to-current converter corresponding to a control voltage generated by the analog filter. The second current is modified when the PLL operates in the analog loop. At step 620, the oscillator signal is generated based on at least one of the first and second currents. The PLL continues to operate in the analog loop until a phase lock is achieved between the feedback signal and the input reference signal. Subsequent to achieving the phase lock, the analog loop is used to control the frequency and phase variation across on-the-fly temperature and supply variations to maintain the phase lock.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

What claimed is:

1. A Phase Locked Loop (PLL) for generating an oscillator signal, comprising:
   a phase-frequency detector (PFD) for generating an analog error signal based on an input reference signal and a feedback signal, wherein the feedback signal is generated using the oscillator signal;
   a digital loop, connected to the PFD, for enabling a frequency lock between the input reference signal and the feedback signal, the digital loop comprising:
      a time-to-digital converter (TDC), connected to the PFD, for converting the analog error signal to a digital error signal;
      a digital filter, connected to the TDC, for generating one or more control words based on the digital error signal; and
      a digital-to-analog converter (DAC) current source, connected to the digital filter, for generating a first current corresponding to the one or more control words;
   an analog loop, connected to the PFD, for enabling a phase lock between the input reference signal and the feedback signal, the analog loop comprising:
      a charge pump, connected to the PFD, for generating a charge pump current based on the analog error signal;
      an analog filter, connected to the charge pump, for generating a control voltage based on the charge pump current;
      a voltage-to-current converter, connected to the analog filter, for generating a second current based on the control voltage;
   a current-controlled oscillator (CCO), connected to the DAC current source and the voltage-to-current converter, for generating the oscillator signal based on at least one of the first current and the second current; and
   a frequency divider connected between the CCO and the PFD for generating the feedback signal by adjusting the frequency of the oscillator signal,
   wherein the TDC comprises one or more tapped delay lines and a loop feedback counter for converting the analog error signal into the digital error signal, and a thermometric to binary converter for converting one or more thermometric signals generated using the analog error signal into one or more binary signals.

2. The PLL of claim 1, wherein the PFD generates an UP signal first when the input reference signal leads the feedback signal.

3. The PLL of claim 1, wherein the PFD generates a DOWN signal first when the input reference signal lags the feedback signal.

4. A system for generating an oscillator signal, comprising:
   a phase-frequency detector (PFD) for generating an analog error signal based on an input reference signal and a feedback signal, wherein the feedback signal is generated using the oscillator signal;

a digital loop, connected to the PFD, for enabling a frequency lock between the input reference signal and the feedback signal, the digital loop comprising:
  a time-to-digital converter (TDC), connected to the PFD, for converting the analog error signal to a digital error signal;
  a digital filter, connected to the TDC, for generating one or more control words using the digital error signal; and
  a digital-to-analog converter (DAC) current source, connected to the digital filter, for generating a first current corresponding to the one or more control words;
an analog loop, connected to the PFD, for enabling a phase lock between the input reference signal and the feedback signal, the analog loop comprising:
  a charge pump, connected to the PFD, for generating a charge pump current based on the analog error signal;
  an analog filter, connected to the charge pump, for generating a control voltage based on the charge pump current; and
  a voltage-to-current converter, connected to the analog filter, for generating a second current based on the control voltage; and
  a current-controlled oscillator (CCO), connected to the DAC current source and the voltage-to-current converter, for generating the oscillator signal based on at least one of the first current and the second current,
wherein the TDC comprises one or more tapped delay lines and a loop feedback counter for converting the analog error signal to the digital error signal, and a thermometric to binary converter for converting one or more thermometric signals generated using the analog error signal into one or more binary signals.

5. The system for generating an oscillator signal of claim 4, further comprising a frequency divider connected between the CCO and the PFD for adjusting the frequency of the oscillator signal to generate the feedback signal.

6. The system for generating an oscillator signal of claim 4, wherein the PFD generates an UP signal first when the input reference signal leads the feedback signal.

7. The system for generating an oscillator signal of claim 4, wherein the PFD generates a DOWN signal first when the input reference signal lags the feedback signal.

* * * * *